United States Patent [19]

Steennis et al.

[11] Patent Number: 5,854,556
[45] Date of Patent: Dec. 29, 1998

[54] MEASUREMENT SYSTEM FOR PARTIAL DISCHARGES ON DIELECTRICS IN COAXIAL CABLES

[75] Inventors: Evert Frederik Steennis; Edwin Pultrum, both of Arnhem; Petrus Arnoldus Antonius Francisca Wouters, Eindhoven; Egbertus Johannes Maria Van Heesch, Vught, all of Netherlands

[73] Assignee: N.V. Kema, Arnhem, Netherlands

[21] Appl. No.: 634,308

[22] Filed: Apr. 16, 1996

[30] Foreign Application Priority Data

Apr. 21, 1995 [EP] European Pat. Off. .............. 95201031

[51] Int. Cl.⁶ .................................................. G01R 31/02
[52] U.S. Cl. .......................... 324/541; 324/536; 324/544; 324/551
[58] Field of Search ..................................... 324/536, 539, 324/541, 543, 544, 551

[56] References Cited

U.S. PATENT DOCUMENTS

| 3,443,158 | 5/1969 | Arndt ........................................ 324/543 |
| 3,524,133 | 8/1970 | Arndt ........................................ 324/543 |
| 4,301,399 | 11/1981 | Miller et al. ............................. 324/544 |
| 4,779,051 | 10/1988 | Grunewald et al. ...................... 324/536 |
| 4,950,957 | 8/1990 | Asars et al. ........................... 324/539 X |
| 5,323,117 | 6/1994 | Endoh et al. ............................ 324/551 |
| 5,359,293 | 10/1994 | Boksiner et al. ........................ 324/544 |

FOREIGN PATENT DOCUMENTS

| 0629866 | 12/1994 | European Pat. Off. . |
| 5172889 | 7/1993 | Japan . |
| 94/10579 | 5/1994 | WIPO . |

*Primary Examiner*—Diep N. Do
*Attorney, Agent, or Firm*—Banner & Witcoff, Ltd.

[57] ABSTRACT

A method and apparatus for detecting partial discharges in cables and accessories. An electrical interruption is created in, for example, the sheath conductor of a cable, and the voltage of high frequency signal components, created by a partial discharge, is measured across the interruption. The interruption is short-circuited to allow low frequency signals to pass across the interruption, thus preventing low frequency signals from being measured. This is useful because the signal/noise ratio of the frequency range measured according to this invention is more favourable. Also, in order to properly and accurately measure a partial discharge, it is important to relate measurements to the main supply voltage of the cable. The present invention also provides a method wherein prior to display the signal is combined with a signal representing the main supply voltage.

14 Claims, 3 Drawing Sheets

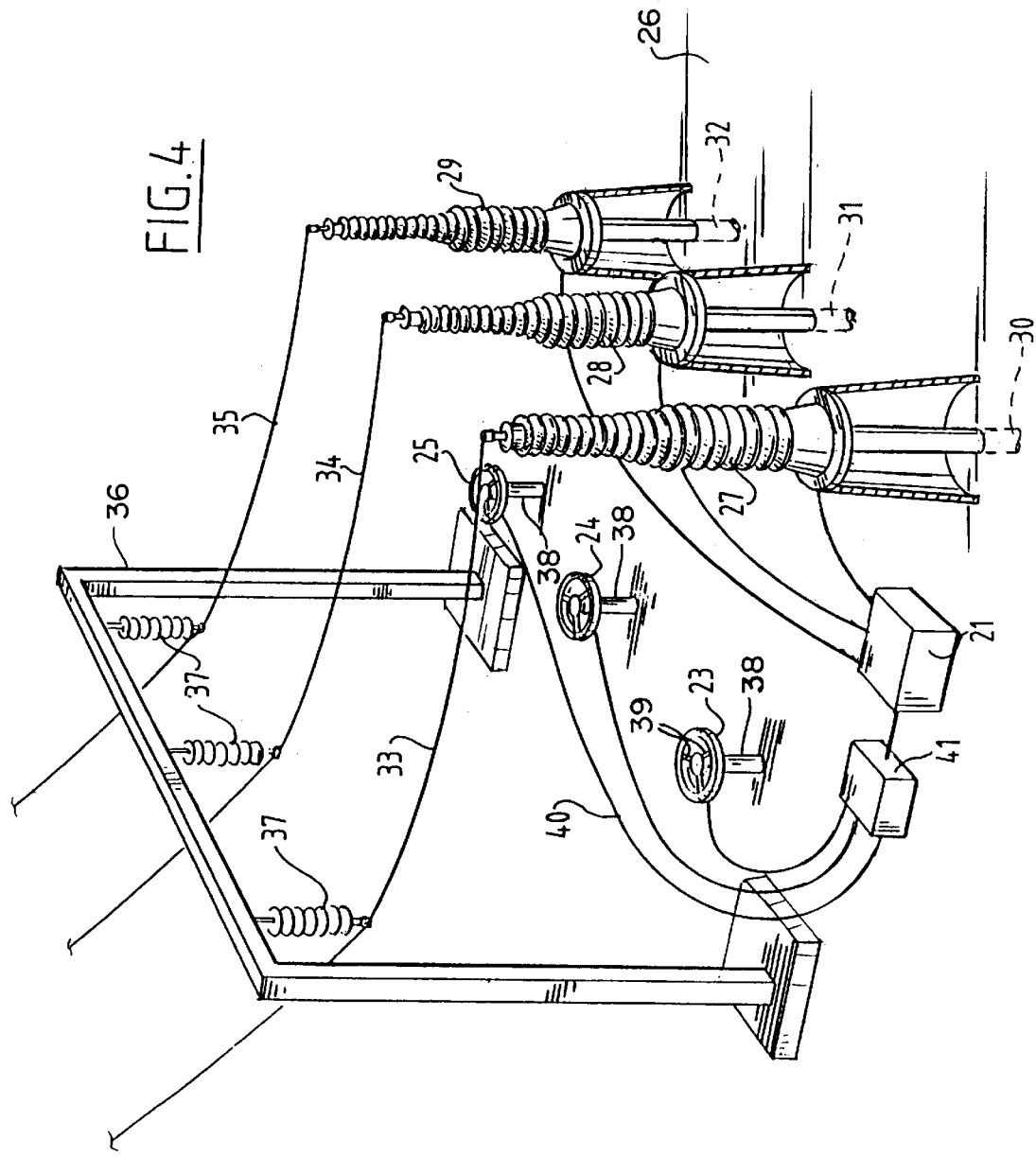

MEASUREMENT SYSTEM FOR PARTIAL DISCHARGES ON DIELECTRICS IN COAXIAL CABLES

BACKGROUND OF THE INVENTION

The present invention relates to a method and a device for measuring partial discharges in cables and cable accessories (henceforth collectively referred to as cables.

Partial discharges are discharges which occur in the dielectric located between the inner conductor and the earth shield of a high-voltage cable, wherein complete breakdown does not take place.

The occurrence of such partial discharges causes deterioration of the quality of a cable. Partial discharges are also often the initiator of complete discharges (breakdown).

Partial discharges occur inter alia in cables provided with a dielectric manufactured from plastic. With the increasing use of such cables it is important to have available a measuring method with which such partial discharges can be detected, also in the case of already installed cables.

Known from the Netherlands patent application 9201944 is a method and a device for detecting partial discharges which makes use of a measuring coil or measuring clip.

This method is however only applicable in cables provided with an earth shield, wherein a conductor incorporated in the earth shield extends helically.

This is certainly not the case with all cables. Large numbers of cables are thus provided with a non-woven, for instance solid, earth shield, wherein this method is not applicable. The present invention relates to a method and device applicable with such cables. In order to be able to determine the occurrence of partial discharges in the case of such a solid metal shield it is necessary to interrupt the metal earth shield and measure the voltage across the interruption. Interrupting the shield includes electrically dividing the shield into at least two parts. Such interruption may be accomplished by, for example, separating the shield as shown in FIG. 1.

In order to then not destroy the operation of the cable it is necessary or, as the case may be, desirable to short-circuit the metal earth shield on both sides of the interruption of the conducting earth shield in a manner such that the intended measurement is not affected.

By displaying the measured voltage across the interruption, the quality of the partial discharge can be determined. By, for example, displaying an image an the screen of an oscilloscope, making a print-out by means of an oscillograph, or storing an image in a memory in digital form. Examination of an image can provide information relating to the seriousness and the nature of the partial discharge.

A method for determining the quality of partial discharges in the insulation of cables is thus generally known comprising the following steps of: interrupting the metal earth shield of the cable; connecting both sides of the interrupted sheath to a measuring instrument; arranging a connection between both sides of the interrupted sheath which is at least suitable for transferring signals with a main frequency; and displaying the signal.

It will be apparent that the magnitude of the voltage occurring over the interruption is very small, so that very sensitive measuring equipment must be used to display the relevant voltage. It is pointed out that according to the prior art the frequency range extending between 100 Hz and about 0.5 MHz is known to exhibit the largest voltage phenomena associated with such a partial discharge, so that the signal/noise ratio is the greatest at that frequency range. However, many interference signals are present in the relevant frequency range which originate for instance from broadcasting transmitters, so that such measurements are often disrupted by these interference signals.

SUMMARY OF THE INVENTION

The object of the present invention is to avoid the above stated problems.

This object is achieved in that only signal components with frequencies greater than 0.5 MHz are displayed.

As a result, the interference associated with the frequency range between 100 Hz and 0.5 MHz is avoided. It is noted here that the signal/noise ratio of the frequency range applied according to the invention is more favourable.

Instead of a cut-off frequency of 0.5 MHz it is possible to select other cut-off frequencies, for instance 1 MHz, 2 MHz, 5 MHz, 10 MHz or intermediate cut-off frequencies.

Another interesting aspect of the said frequency range lies in the fact that although a partial discharge generates phenomena which extend over a frequency range of about 100 Hz to several hundred MHz, the distance over which the relevant signals are transmitted is highly frequency-dependent. Signals with a low frequency generally travel over a great distance, while signals with higher frequencies travel over shorter distances as a result of damping and dispersion.

It is important to know that partial discharges occur in the greatest number of cases in accessories of cables; that is, in cable sleeves, end fittings and the like. This is useful because in such accessories an interruption of the sheath of the cable is often already present, or the sheath can be easily interrupted. With this knowledge in mind it is necessary to have available a measuring method which is principally intended for partial discharges situated at a relatively short distance, for instance a few metres, from the interruption.

The present invention provides such a method as well as apparatus for measuring partial discharges according to such a method.

The signal to be displayed is preferably limited in frequency by short-circuiting the interruption of the earth shield.

It is moreover attractive herein to make use of a device for determining the quality of a partial discharge occurring in the cable comprising: means for deflecting a measuring voltage occurring over an interruption of the earth shield; and an instrument for displaying the measuring voltage, characterized in that the deflecting means are formed by an interruption of the sheath of the cable, wherein both sides of the interruption are connected to the measuring instrument and the interruption of the earth shield is short-circuited by a connection suitable for allowing passage of signals with a frequency smaller than 0.5 MHz.

In order to properly be able to examine the quality of a partial discharge, its effect on the signal voltage is important to relate it to the voltage of the cable in which the partial discharge takes place (the main supply voltage). The present invention provides a method wherein prior to display the signal is combined with a signal representing the main supply voltage.

It is especially attractive when the signal representing the main supply voltage is generated in contact-free manner, for example in capacitive manner. This has the advantage that the measuring equipment does not have to be connected to conductors carrying high-voltage, so that the measurement, when an interruption of the sheath of the cable is already present, can be performed without interrupting operation of the cable. It will be apparent that this is a significant advantage. It is advantageous to derive the signal representing the main supply voltage in a capacitive manner by making use of an electrode coupled capacitively to a conductor carrying the main supply voltage.

Such a method is applicable for single-phase systems such as occur in power supply systems of rail networks supplied with alternating current.

For use in the much more common three-phase systems the signal representing the main supply voltage is generated by at least two, preferably three, electrodes each of which is coupled capacitively to a conductor carrying its respective phase voltage.

It is noted here that the use of such a capacitive measuring system is known from the publication "Three-phase voltage measurements with simple open air sensors", 7'h International Symposium on High Voltage Engineering, Dresden, 26–30 Aug. 1991.

BRIEF DESCRIPTION OF THE DRAWINGS

The present invention will subsequently be elucidated with reference to the annexed drawings, in which:

FIG. 4 shows a perspective, schematic view of an arrangement for performing the method according to the invention.

DETAILED DESCRIPTION OF THE INVENTION

Figure 1:
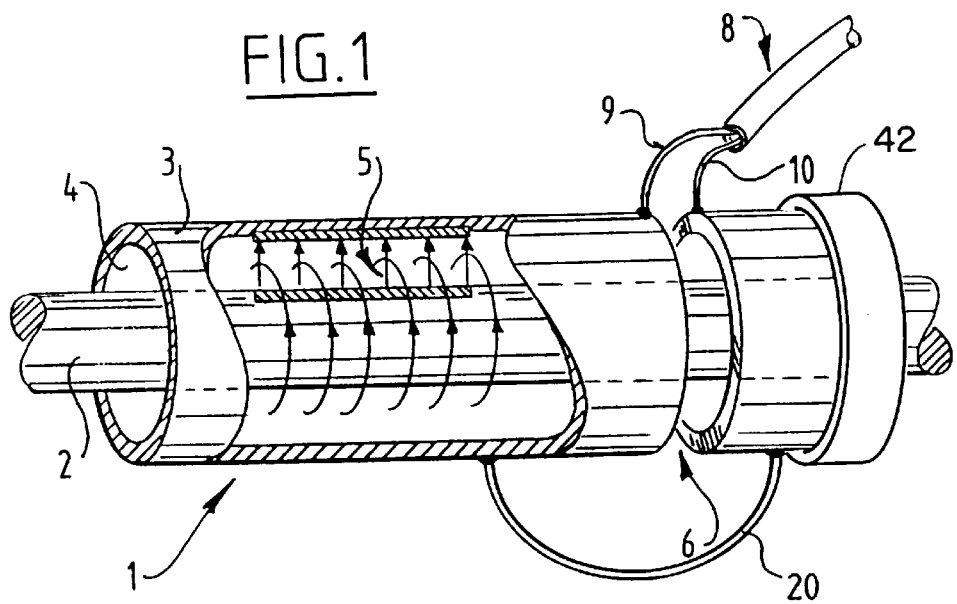
FIG. 1 shows a schematic, perspective view of a cable in which a partial discharge occurs, wherein the earth shield of this cable is provided with an interruption for detecting the partial discharge.

Shown in FIG. 1 is a cable 1 with a coaxial structure, which cable is formed by a central conductor 2 and a sheath conductor 3, between which is arranged a dielectric 4. For protection and insulation, plastic insulation material 42 is present around the sheath conductor 3.

Due to the occurrence of a partial discharge which is indicated by 5, a current travelling in lengthwise direction of the cable will begin to flow in the sheath conductor 3. Because the sheath conductor is provided with an interruption 6, it is possible to measure the voltage over this interruption. Connected for this purpose over the interruption is a measuring cable 8 of which two conductors 9, 10 respectively are connected to both pieces of the sheath 3 located on either side of the interruption 6. In order to filter certain frequency ranges of the measured voltage according to the invention the interruption 6 in sheath 3 is short-circuited only for signals with low frequencies via the connecting wire 20. The short-circuit otherwise serves to maintain the proper operation of the cable. The high-frequency signals are thus fed to the measuring instrument.

Figure 2:
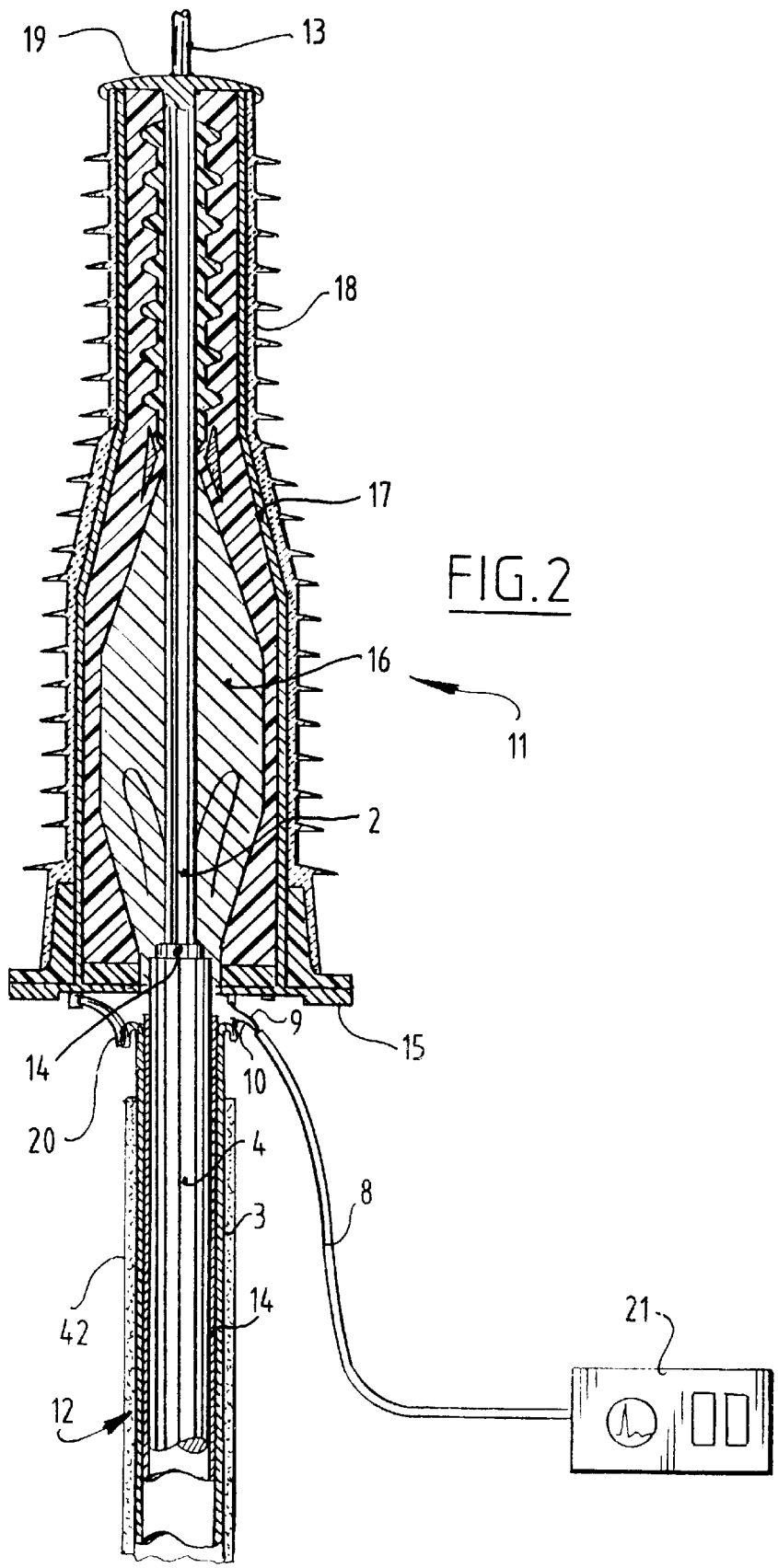
FIG. 2 is a sectional view of an end fitting, wherein an interruption of the sheath of the cable is present for detecting the partial discharge.

A similar situation is shown in FIG. 2. Shown herein is an end fitting 11 to which is connected an underground cable 12. Such a situation occurs for instance at the transition between an underground cable and a high-voltage line. The high-voltage line 13 is herein connected to the top of the end fitting 11. The underground cable is provided with a central conductor 2 and a sheath conductor 3, between which is arranged the dielectric 4. Further present are semi-conductor voltage-controlling layers 14 which are however of no significance for the present invention and which are not further discussed. The end fitting 11 rests on a conducting plate 15, while end fitting 11 is formed by an insulating mass 16, a reinforcing housing 17, on the outside of which is arranged a housing 18 also manufactured from insulating material. The construction of the end fitting is not otherwise important and is not discussed further.

In the situation shown in FIG. 2, the sheath 3 of underground cable 12 is connected to the conducting plate 15 by means of a connecting cable 20 usually made of Litz. There is thus no question here of a complete galvanic interruption but of an interruption which only allows passage of low-frequency signals and which in a three-phase system is formed by the capacitive current of the end fitting or the cable. In other cases the sheath 3 can be connected directly to the conducting plate 15. In that case an interruption of sheath 3 will have to be realized. By not joining the connecting wire directly onto the edges of the interruption but at a distance, for example several centimetres from the interruption, the desired frequency-independent behaviour is reinforced. The high-frequency signals, that is, with a frequency higher than 0.5 MHz, do not cross over such an interruption. It is thus possible to connect the measuring wire 8 over this interruption by means of the cores 9 and 10. The measurement signal is hereby supplied to the measuring instrument 21.

As already stated in the introduction, the instrument 21 is formed by a display device which can be formed by an oscilloscope, and an oscillograph with which it is possible to obtain oscillograms of the voltage phenomenon, or by a digital instrument with which the result of the measurement can be stored in digital form and subsequently printed out in processed form and made visible.

In order to achieve the advantage of the invention, as also stated in the preamble, use is made of a connection with a filtering effect, for instance by using the short-circuit connection, with which frequencies lower than 0.5, 1, 2, 5 or 10 MHz are largely suppressed. The displayed image is thus limited to only the signal components whose frequency is higher than the cut-off frequency and which can only travel a short distance along the cable sheath, but wherein such signals are only to a small extent sensitive to, or, as the case may be, influenced by, noise, broadcasting signals and other interference signals.

In order to enable a good interpretation of the displayed signal it is important that this signal is related to the momentary voltage level in the cable in which the partial discharge occurs. It is thus attractive to combine the measurement signal with the supply voltage (main supply voltage).

Figure 3:
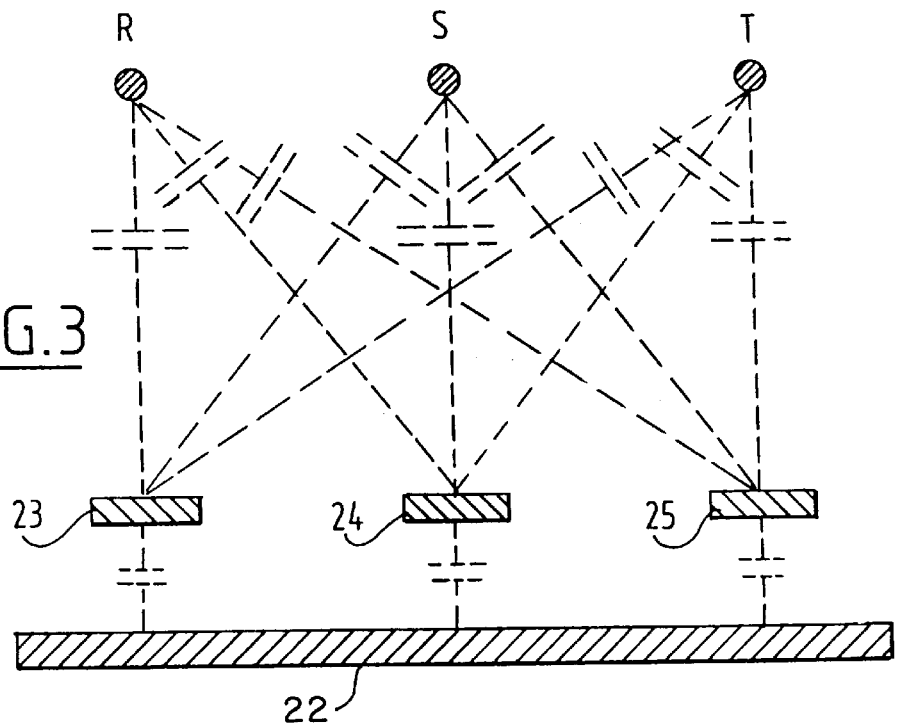
FIG. 3 is a schematic view of a capacitive measuring system.

Use is made for this purpose of the structure shown in FIG. 3. Shown herein is a three-phase system which is formed by three conductors R, S and T which carry a three-phase voltage system. The three conductors R, S and T are situated above a conductor 22 with earth potential formed for instance by the earth surface, above which three electrodes 23, 24 and 25 are disposed in insulated manner.

Due to the capacitive coupling between the electrodes 23, 24 and 25 and the voltage-carrying conductors R, S and T it is possible to obtain from the voltages occurring on electrodes 23, 24 and 25 images of the voltages prevailing on conductors R, S and T. The precise manner in which this takes place does not form part of the invention and reference is made herefor to the above cited journal article "Three-phase voltage measurements with simple open air sensors". It is noted however that use can be made herein of a so-called matrix circuit for deflecting images of the relevant voltages.

It is remarked here that the configuration shown in FIG. 3 depicts a normally occurring three-phase system. As a consequence of the symmetry of a three-phase system it is possible to make use of only two electrodes.

It is furthermore possible, for instance in the case of single-phase systems, to make use of a single electrode. Because it is only necessary for interpretation of the measurement signals that a relation is obtained with the phase of the voltages prevailing in the conductors, it is in principle sufficient to make use of the signals coming from the electrodes by combining these signals in a linear manner.

Finally, FIG. 4 shows a schematic view of a measuring arrangement. Arranged herein on a conducting surface 26 are end fittings 27, 28 and 29 to each of which is connected an underground cable 30, 31 and 32 respectively. To the top side of each of the connections are connected respective high-voltage lines 33, 34 and 35. The high-voltage lines are herein suspended from a portal 36 by means of insulators 37. In order to perform the measurement the voltages occurring over the interruptions on the underside of the end fittings 27, 28 and 29 are fed by means of three measuring cables 8 to the measuring instrument 21. This means that there is a three-fold measurement here; it is of course equally possible to make use of a single measurement or a double measurement.

In order to measure the voltages prevailing on the lines 33, 34 and 35 use is made of three electrodes 23, 24, 25 which in this embodiment are each annular and which rest on the conducting surface 26 by means of an insulating stem 38 and insulating connections 39. Each of the electrodes is connected by means of cables 40 to a matrix circuit 41, which matrix circuit calculates the voltage prevailing on the lines 33, 34 and 35 from the voltages occurring on the electrodes 23, 24, 25 and supplies the desired phase voltage to the measuring instrument 21.

The method of combining the measurement signal with the main supply voltage is not limited to the method for obtaining the measurement signal described in the present application; it can also be applied in for instance the method according to the Netherlands patent application number 92.01944.

We claim:

1. A method comprising:

inserting an interruption in a sheath conductor of a coaxial cable to create first and second sections disposed on opposite sides of the interruption;

arranging a conductive connection between the first and second sections suitable for transferring a first signal, the first signal comprising a current flowing through the first section at a main frequency;

measuring a second signal across the first and second sections, the second signal comprising a voltage between the first and second sections; and displaying only signal components of the second signal with frequencies greater than 0.5 MHz.

2. The method as claimed in claim 1, including configuring the interruption such that the second signal comprises substantially only signal components with frequencies greater than 1 MHz, 2 MHz, 5 MHz, or 10 MHz.

3. The method as claimed in claim 1 wherein the step of arranging the conductive connection includes forming the conductive connection using a conductor connected to each of the first and second sections in a manner which limits the conduction of high frequencies through the conductive connection.

4. The method as claimed in claim 1, wherein the step of arranging the conductive connection includes forming the conductive connection using a conductive wire connected to each of the first and second sections at a distance from the interruption.

5. The method as claimed in claim 1, including generating a third signal representative of main frequency components of the first signal; and combining the third signal with the second signal prior to the step of displaying.

6. The method as claimed in claim 5, wherein the step of generating the third signal includes generating the third signal from the first signal in a contact-free manner.

7. The method as claimed in claim 6, wherein the step of generating the third signal includes generating the third signal from the first signal in a capacitive manner.

8. The method as claimed in claim 7, wherein the step of generating the third signal includes using at least one electrode coupled capacitively to a conductor of the coaxial cable carrying the first signal.

9. The method as claimed in claim 7, wherein the step of generating the third signal includes capacitively coupling first and second electrodes to first and second conductors, wherein the first electrode is coupled capacitively to the first conductor, the second electrode is coupled capacitively to the second conductor, and each of the first and second conductors is carrying a different phase of the first signal.

10. A method for detecting partial discharges in an insulation of a cable, a first voltage being applied to a sheath conductor of the cable, the method comprising:

measuring a second voltage across an interruption formed in a sheath conductor of a coaxial cable, the interruption separating the sheath conductor into first and second sections disposed on opposite sides of the interruption; and displaying frequencies of the second voltage that are greater than 0.5 MHz.

11. The method of claim 10 including forming a conductive connection between the first and second sections.

12. The method of claim 11 wherein the step of forming a conductive connection includes forming a conductive wire connected to each of the first and second sections at a distance from the interruption.

13. The method of claim 12 including utilizing the wire to substantially block frequencies above 0.5 MHz.

14. The method of claim 13 including capacitively measuring a first current in the sheath conductor, the first current being caused by the first voltage being applied to the sheath conductor.

* * * * *